United States Patent
Carras et al.

(10) Patent No.: US 7,608,814 B2
(45) Date of Patent: Oct. 27, 2009

(54) OPTICAL STRUCTURE FOR LOCALISING AN ELECTROMAGNETIC FIELD AND DETECTOR OR EMITTER DEVICE INCLUDING SUCH A STRUCTURE

(75) Inventors: Mathieu Carras, Montrouge (FR); Alfredo De Rossi, Paris (FR); Jean-Philippe Schnell, Paris (FR)

(73) Assignee: Thales (FR)

( * ) Notice: Subject to any disclaimer, the term of this patent is extended or adjusted under 35 U.S.C. 154(b) by 0 days.

(21) Appl. No.: 12/092,873

(22) PCT Filed: Nov. 10, 2006

(86) PCT No.: PCT/EP2006/068334

§ 371 (c)(1),
(2), (4) Date: May 7, 2008

(87) PCT Pub. No.: WO2007/054560

PCT Pub. Date: May 18, 2007

(65) Prior Publication Data

US 2008/0251704 A1    Oct. 16, 2008

(30) Foreign Application Priority Data

Nov. 10, 2005  (FR) .................................. 05 11463

(51) Int. Cl.
*G01D 5/36* (2006.01)
(52) U.S. Cl. .............................. 250/237 G; 250/370.14; 257/432
(58) Field of Classification Search ............. 250/237 G, 250/216, 370.01, 370.14; 257/294, 295, 257/432, 435; 356/328; 359/332
See application file for complete search history.

(56) References Cited

U.S. PATENT DOCUMENTS

| 5,455,178 A | 10/1995 | Fattinger |
| 7,400,399 B2 * | 7/2008 | Wawro et al. ............... 356/328 |
| 7,501,636 B1 * | 3/2009 | Son et al. ............... 250/370.14 |
| 2006/0243892 A1 | 11/2006 | Bois et al. |
| 2006/0289728 A1 | 12/2006 | Bois et al. |

(Continued)

FOREIGN PATENT DOCUMENTS

EP      1466393     12/2002

(Continued)

OTHER PUBLICATIONS

Dmitruk N. L. et al., "Ultraviolet Responsivity Control in Schottky Barrier Heterostructures with Textured Interface." Thin Solid Films, Elsevier-Sequoia S.A. Lausanne, CH, vol. 364, No. 1-2, Mar. 2000, pp. 280-283, XP004195111 ISSN: 0040-6090.

(Continued)

*Primary Examiner*—Kevin Pyo
(74) *Attorney, Agent, or Firm*—Lowe Hauptman Ham & Berner, LLP

(57) ABSTRACT

An optical structure enabling properties of the surface plasmons to be used is defined from a substantially binary, parameterizable unit pattern $M_E$. The parameters a, b, c, d and $h_g$ of the pattern are chosen so as to maximize the complex amplitudes of the first two harmonics of the complex Fourier series describing the pattern $M_E$. This structure is advantageously used in combination with a photodetector, an infrared or Terahertz optical wave emitter, or a field emission device.

30 Claims, 7 Drawing Sheets

U.S. PATENT DOCUMENTS

2007/0085114 A1     4/2007    De Rossi et al.

FOREIGN PATENT DOCUMENTS

FR          2863774      6/2005

OTHER PUBLICATIONS

U.S. Appl. No. 11/721,970 filed Jun. 15, 2007, Pierre Legagneux et al. (Not Yet Published).

Hagmann, Mark J., "Photomixing in Resonant Laser-Assisted Field Emission—A New Technique for Wide-Band-Tunable Terahertz Sources", IEEE Transaction on Microwave Theory and Techniques review, vol. 52, No. 10, Oct. 2004, pp. 2361-2365.

\* cited by examiner

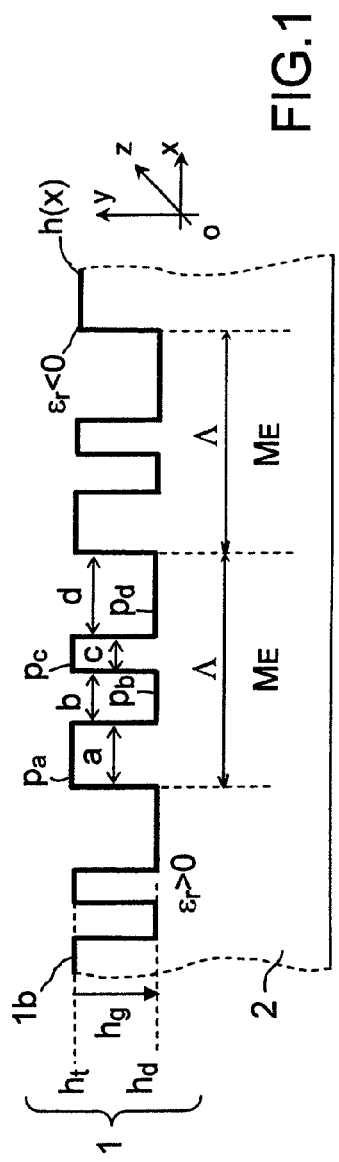
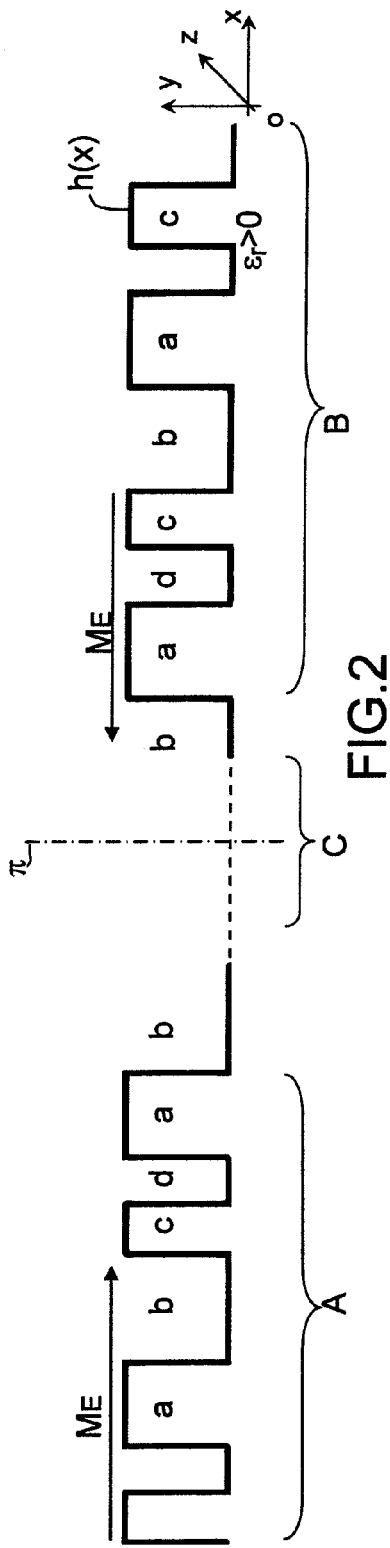
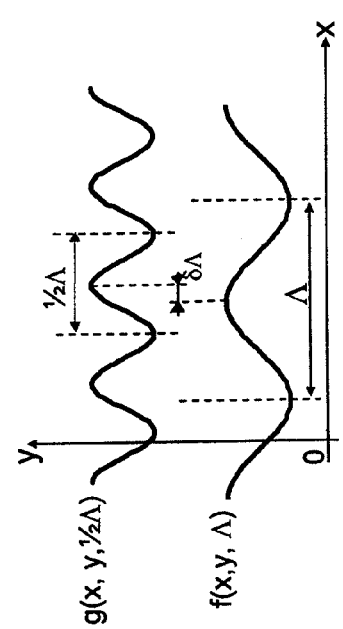

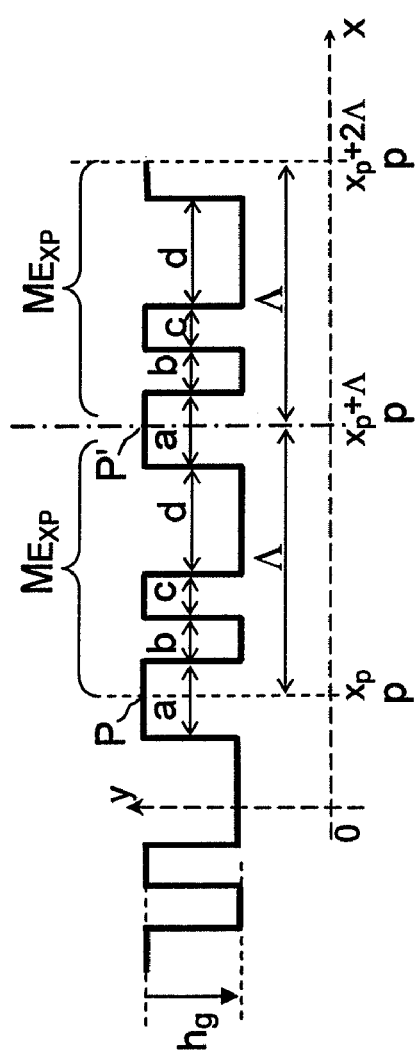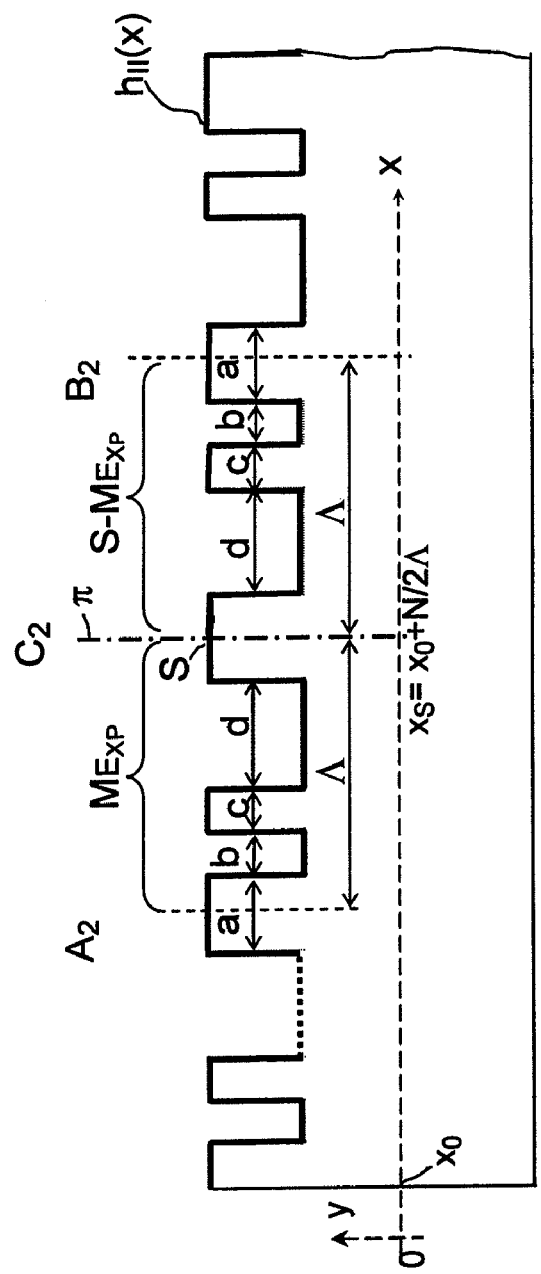

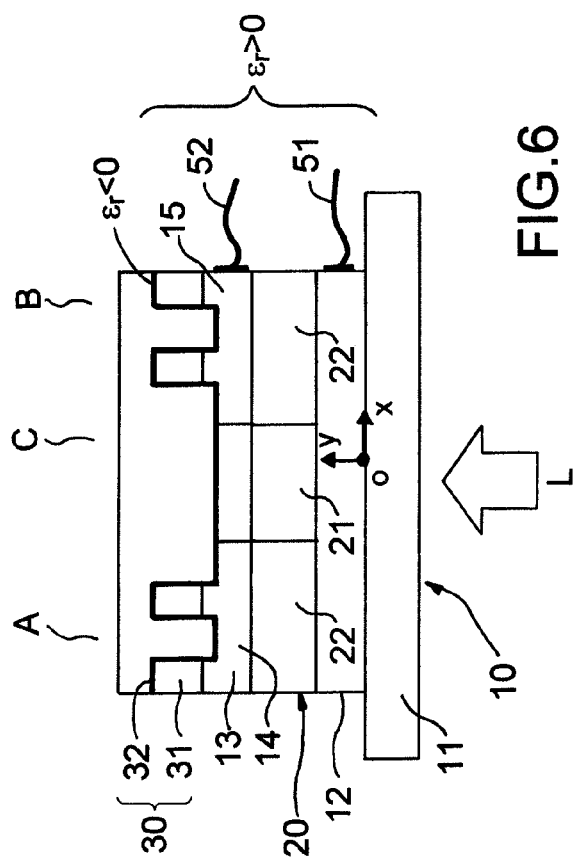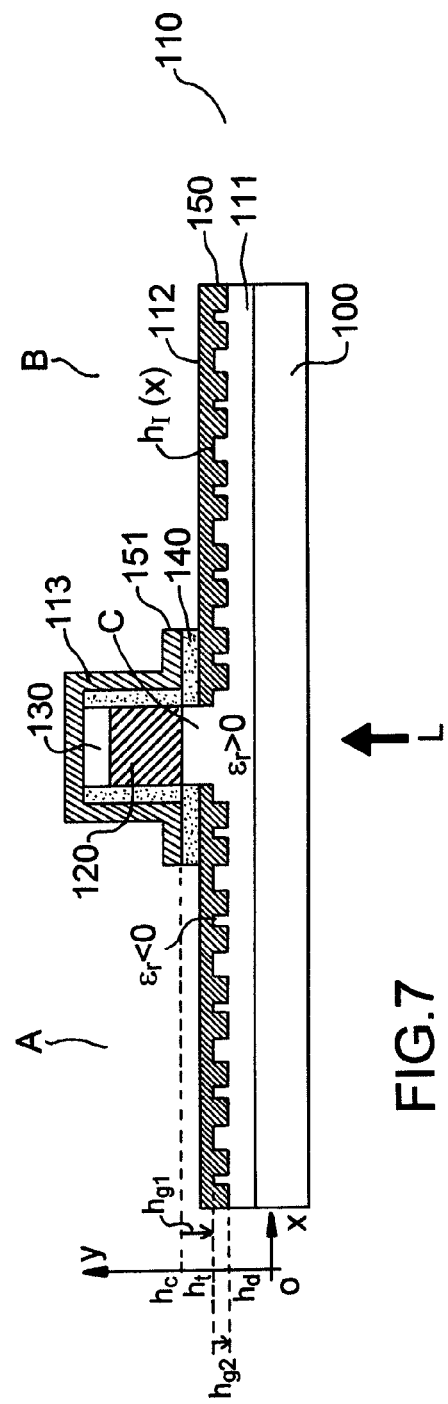

OPTICAL STRUCTURE FOR LOCALISING AN ELECTROMAGNETIC FIELD AND DETECTOR OR EMITTER DEVICE INCLUDING SUCH A STRUCTURE

CROSS-REFERENCE TO RELATED APPLICATIONS

The present Application is based on International Application No. PCT/EP2006/068334, filed on Nov. 10, 2006, which in turn corresponds to French Application No. 05 11463, filed on Nov. 10, 2005, and priority is hereby claimed under 35 USC §119 based on these applications. Each of these applications are hereby incorporated by reference in their entirety into the present application.

FIELD OF THE INVENTION

The present invention relates to an optical structure for localising an electromagnetic field in the vicinity of an active optical area.

BACKGROUND OF THE INVENTION

In particular, such optical structures are used in photodetectors, in particular in quantum well photodetectors, known under the acronym QWIP (for Quantum Well infrared Photodetector), operating in the medium infrared, in order to improve their detectivity. More precisely, these optical structures are used therein to obtain a concentration of the field into the detecting active area, which can thus have substantially reduced dimensions, to match the field concentrating area. In practice, the active area of the photodetector is provided in the vicinity of the structure and focused on the field concentrating (or localising) area. As a result, the signal to noise ratio is notably improved with respect to photodetector devices having no such optical structures: since the active area is smaller, the photoelectric noise generated therefrom is decreased. The active area is adapted to the field concentrating area, and as a result, nothing is lost in terms of wanted signal.

Concentrating the luminous energy on a reduced photodetector surface obtained through these optical structures relies on exploiting localising phenomena of near field and on properties of some surface waves called surface plasmons.

In particular, such optical structures for photodetector are disclosed in the application FR 000314717. In an exemplary embodiment given in this application, a corresponding optical structure includes a transparent dielectric material in the spectral range of the optical radiation. This layer is etched so as to obtain a relief y=h(x,z) in an orthogonal reference frame Oxyz, invariant along Oz and variable along Ox. It is covered with a metal film. The profile in the plane Oxy is such that it can be defined by a mathematical function, which is the sum of two periodical functions f and g, with f representing the coupling function between the incident light on the photodetector and the electromagnetic field of the surface excited wave, of space period $\Lambda$ and g representing the localising function of space period $\frac{1}{2}\Lambda$ and which has a fault in periodicity, located in the centre portion of the optical structure. The relative phase $\delta\Lambda$ between f and g determines the ultimate coupling properties of the surface wave. Let be $\lambda$ the average wavelength of the incident radiation, and n the average refractive index of the optical structure, then the period $\Lambda$ is advantageously $\lambda/2n$ for the incidence wave coupling to be optimum. Concentrating the field is achieved in an area around the fault in periodicity of the structure.

In one example, corresponding optical structures have a «stepwise» or facet profile. The profile is obtained by means of several etching steps, whose number depends on the complexity of the profile to be produced.

There are technological problems with respect to the etching steps required to produce the optical structure disclosed in this application. In particular, this results in problems of re-alignment of the etching masks between each step and of checking the etching depth, that is step height, which is one of the most difficult technological parameters to be controlled.

Further, these optical structures provide low flexibility as to setting the localising properties of the electromagnetic wave under the optical structure. In particular, decoupling the wave decay along the Ox axis and along the Oy axis is unknown, because the only degree of freedom in the structure is the etching step duration. In the optical structures obtained according to that principle, the relative phase between both superposed networks is fixed.

SUMMARY OF THE INVENTION

It is an object of the invention to improve the optical structures for localising an electromagnetic field, by making their parameterising and manufacturing easier, so as to improve their properties while reducing manufacturing costs and improving reliability. It is another object of the invention to make the parameterising of these structures easier, to allow a wider applicability of such optical structures, in particular to other devices using photosensitive members, such as light or electron emitters.

It is thus an object of the invention to define an optical structure providing several degrees of freedom as to its parameterising, in such a way to allow the separated setting of different parameters, depending on the localising effects along the Ox and Oy axes being searched for.

Another object of the invention is an optical structure, easy to make, that can thus be readily integrated in a manufacturing process of an optical device, and that is applicable to a wider diversity of photodetector and/or emitter devices.

According to the invention, an optical structure is defined from the periodical repetition of a unit pattern, whose profile in Oxy cross section is defined by a substantially binary shape, defined by two relative heights, that define an etching depth (on 00y axis), and four parameters variable on Ox axis. In the first order, the profile of the unit pattern can be defined by both periodical functions f and g which are described above. The pattern parameters are set with the purpose of obtaining the desired coupling and localising properties for the application under consideration.

Then, a single technological step enables an optical structure with required properties to be obtained, from the drawing of an etching mask.

By producing an area by replicating a unit pattern according to the invention, an optical structure parameterizable, easy to make from the technological point of view and adaptable to various optical emitters or detectors is thereby obtained.

Therefore, the invention relates to a device including at least one active optical member provided in a medium of positive dielectric permeability and, in the proximity of said active member, an optical structure including a layer of a material of negative dielectric permeability, said layer having, located in an orthogonal reference frame Oxyz, a surface having a relief y=h(x,z) invariant along Oz and variable along Ox, the Oy axis being oriented from the positive dielectric permeability medium to said layer of negative dielectric permeability, said surface contacting said positive dielectric permeability medium and including a first relief area, having a profile in 0xy cross section that includes a periodic repetition of a unit pattern and a second relief area symmetrical to said first area with respect to a plane of symmetry parallel to 0yz, said first and second areas being separated by a third layer provided in the centre of the structure, giving rise, compared with said first and second areas, to a fault in periodicity of the relief surface, characterised in that said unit pattern is defined by four succeeding portions, a first portion of full width at half maximum a and a second portion of full width at half maximum b, a third portion of full width at half maximum c and a fourth portion of full width at half maximum d, said first and third portions having substantially the same height $h_t$, said second and fourth portions having substantially the same height $h_d$ different from $h_t$, with $h_t$ strictly higher than $h_d$ and in that a, b, c, d and $h_g = h_t - h_d$ are selected profile parameters such that:

each of them is not zero,

The sum a+b+c+d is equal to the period $\Lambda$ and at least a≠c or b≠d.

The invention also relates to two preferred drawings of the profile, for the properties they provide to the structure, and to applications of the optical structure according to the invention depending on the active area device under consideration: photodetector, optical radiation or electron beam emitter.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIG. 1 shows a portion of the profile of an optical structure according to the invention;

FIG. 2 shows the construction principle of the profile of an optical structure according to the invention;

FIG. 3 represents the two first harmonics of the complex Fourier series that describes the profile of an optical structure according to the invention;

FIGS. 5a and 5b show a second preferred embodiment of an optical structure according to the invention;

FIG. 6 shows a photodetector device including an optical structure according to the invention;

FIG. 7 shows an alternative to such a device, applicable with a structure according to the first preferred embodiment;

DETAILED DESCRIPTION OF THE DRAWINGS

Figure 4:
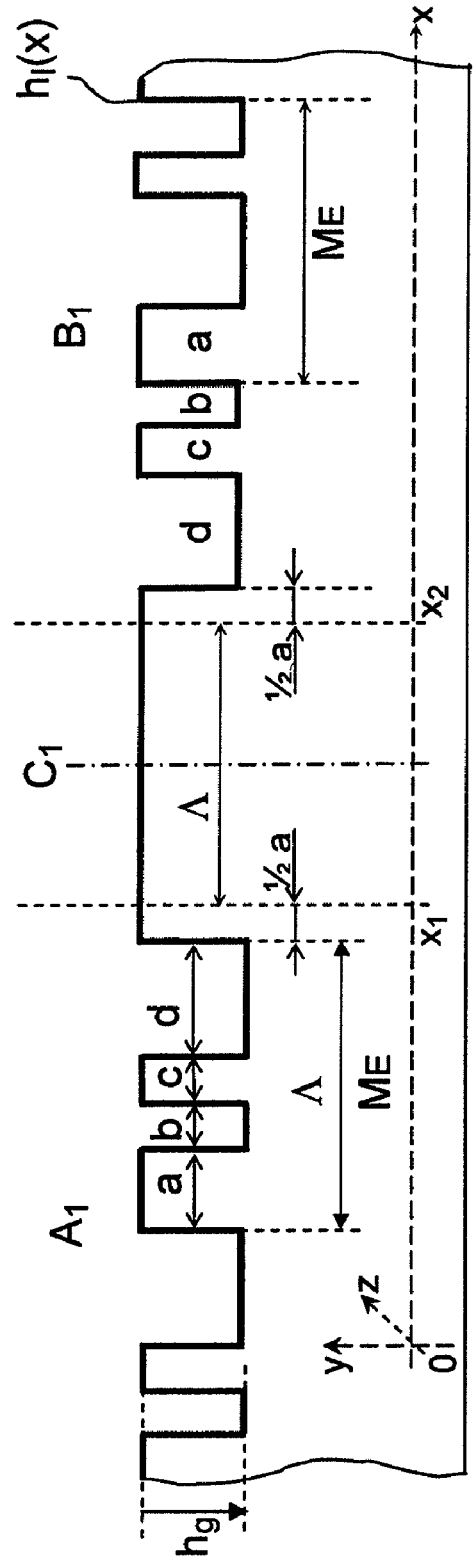
FIG. 4 shows a first preferred embodiment of an optical structure according to the invention.

FIG. 1 shows a cross sectional 0xy view of a portion of an optical structure 1 according to the invention. This optical structure is provided in contact with a medium 2 of positive dielectric permeability $\in_r$. It will be seen that this medium can be a semi-conductor type material or vacuum.

This optical structure 1 includes a layer 1b of a material of negative dielectric permeability $\in_r$, such as a metal or a doped semi-conductor.

An orthogonal reference frame 0xyz is chosen, with 0x and 0z axes being the surfaces axes and 0y axis the height axis. In all figures, let 0y axis be oriented from medium 2 of positive dielectric permeability to the layer 1b of negative dielectric permeability, that is oriented upwards in the figures.

The layer 1b of the optical structure has a surface having a relief y=h(x,z) invariant along 0z, and variable along 0x. Let be y=h(x) the profile of this layer in the 0xy plane. In the portion shown in this figure, this profile corresponds to the periodical repetition, at the period $\Lambda$, of a unit pattern ME defined according to the invention. The unit pattern ME has a length equal to the period $\Lambda$. It is invariant along the 0z axis. It can assume two values $h_t$ or $h_d$ on 0y axis, as a function of x.

The period $\Lambda$ is chosen to correspond to the operating spectral domain of the device into which is integrated the structure, for example a photodetector. Let be $\lambda$ the operating wavelength of detection of the photodetector, then the period $\Lambda$ is chosen so that $\Lambda \cdot \eta_{average}$ is substantially equal to $\lambda$, where $\eta_{average}$ is the average refractive index of the optical structure.

As illustrated in FIG. 1, the unit pattern ME is defined by four parameters a, b, c and d along 0x, and one parameter $h_g$ along 0y.

The parameters a, b, c, d correspond to the widths of four portions of a straight line, a first portion $p_a$ of width a and a second portion $p_b$ of width b, and a third portion $p_c$ of width c and a fourth portion $p_d$ of width d. The first and third portions have substantially the same height $h_t$. The second and fourth portions have substantially the same height $h_d$ different from $h_t$. The parameter $h_g$ is equal to $h_t - h_d$. The parameters a, b, c and d of the profile are chosen so that:

each of them is not zero, their sum a+b+c+d is equal to the period $\Lambda$ and they satisfy the condition: at least a≠c or b≠d.

The parameters a, b, c and d and $h_g$ of the pattern ME determine the coupling and localising properties of the structure according to the invention. In the figure, the profile h(x) is thus substantially binary, the pattern can be described as a series of two slots, whose parameters a, b, c, d define the lengths and gaps, and whose parameter $h_g$ defines the slot height, that is in practice the etching operation depth carried out to obtain the unit pattern ME of the structure according to the invention.

This binary profile is the most effective, but in practice, slightly different profiles can be obtained, in particular with uncertainties of up to 20 percent of the average value on the heights $h_t$ and $h_d$. Consequently, the general pattern of the invention is to be considered by taking the values a, b, c and d at half maximum, with portions $p_a$ and $p_c$ of substantially the same height and portions $p_b$ and $p_d$ of substantially the same height.

There is thus provided 5 parameters defining the profile h(x) for defining an optical structure according to the invention. These parameters are simple to be obtained: a single etching operation is required, and they enable coupling and localising properties of an optical structure according to the invention to be adapted.

Indeed, the profile h(x) can be described as shown in FIG. 3, by a mathematical function equal, in the first order, to the sum of the harmonic of $1^{st}$ order written as $f(x, y, \Lambda)$ of amplitude $\alpha$ and of period $\Lambda$, and the harmonic of $2^{nd}$ order written as $g(x, y, \frac{1}{2}\Lambda)$ of amplitude $\beta$ and of period $\frac{1}{2}\Lambda$ of the corresponding complex amplitude Fourier series.

The relative phase shift $\delta\Lambda$ between both harmonics corresponds to the spacing between two respective maxima (FIG. 3).

In particular, the parameters a, b, c, d and $h_g$ are chosen so that the complex amplitude of the first non-zero harmonic of order higher than two is negligible with respect to the complex amplitudes $\alpha$ and $\beta$ of the harmonics of $1^{st}$ and $2^{nd}$ orders. In practice, they are chosen for the 3rd order to be minimized. They are also chosen so that the relative phase shift $\delta\Lambda$ that determines over the coupling is optimum.

More precisely, the complex amplitude $\alpha$ of the harmonic $f(x, y, \Lambda)$ of $1^{st}$ order 1 is written as:

$$\alpha = h_g \left( \int_a^{a+b} \exp\left(i\frac{2\pi}{\Lambda} \cdot x\right) dx + \int_{a+b+c}^{a+b+c+d} \exp\left(i\frac{2\pi}{\Lambda} \cdot x\right) dx \right) \quad \text{Eq. 1}$$

The complex amplitude $\beta$ of the harmonic $g(x, y, \frac{1}{2}\Lambda)$ of $2^{nd}$ order is written as:

$$\beta = \frac{1}{2} h_g \left( \int_a^{a+b} \exp\left(i\frac{4\pi}{\Lambda} \cdot x\right) dx + \int_{a+b+c}^{a+b+c+d} \exp\left(i\frac{4\pi}{\Lambda} \cdot x\right) dx \right) \quad \text{Eq. 2}$$

The relative phase shift is a function of the phase between $\beta$ and $\alpha$: $\delta\Lambda = \Lambda/2\pi \cdot \Phi(\beta/\alpha)$ (Eq. 3), ($\Phi$ being equal to the inverse tangent of the imaginary part of $\beta/\alpha$ on the real part of $\beta/\alpha$).

Four parameters can be expressed as a function of a fifth one. For example, b, c and d can be expressed as variables, function of a, knowing further that a, b, c and d satisfy a+b(a)+c(a)+d(a)=$\Lambda$. a is then chosen so that the higher orders are minimized, at least the first non-zero order higher than two.

For example, to minimize the third order, a is chosen so that $$\frac{d}{da} \left| \int_a^{a+b(a)} \exp\left(i\frac{6\pi}{\Lambda} \cdot x\right) + \int_{a+b(a)+c(a)}^{a+b(a)+c(a)+d(a)} \exp\left(i\frac{6\pi}{\Lambda} \cdot x\right) \right| \quad \text{(Eq. 4)}$$

is minimum

The profile h(x) of the unit pattern ME according to the invention can thus be defined through a mathematical function, which is the sum of two periodical functions $g(x, y, \frac{1}{2}\Lambda)$ and $f(x, y, \Lambda)$, with f representing the coupling function between light and the electromagnetic field of the surface excited wave, of space period $\Lambda$ and g representing the localising function of space period $2\Lambda$. The relative phase $\delta\Lambda$ between f and g determines the ultimate localising properties of the coupled wave. For a photodetector including an optical structure according to the invention for example, let be $\lambda$ the average wavelength of the incident radiation, then, advantageously, the pitch $\Lambda$ must be equal to $\lambda/n$ for the coupling between the luminous wave incident on the photodetector and the wanted surface mode to be optimum. These properties depend on the parameters a, b, c, d and $h_g$.

A periodical structure according to the invention is based on replicating the unit pattern ME just described, combined with producing a fault in periodicity of the structure, preferably in an area located at the centre of the structure.

More precisely, an optical structure according to the invention thus includes, as schematically shown in FIG. 2, a first relief area A and a second relief area B, each of which is obtained through the periodical repetition of the unit pattern ME, of period $\Lambda$. These two areas A and B are symmetrical to each other with respect to a plane of symmetry $\Pi$ parallel to 0yz. In FIG. 2 which is a figure in 0xy cross section, it can be seen the axis of symmetry parallel to 0y of this plane $\Pi$.

Both areas A and B are separated by a third area C provided at the centre of the structure.

The area C creates a fault in periodicity of the profile y=h(x,z) of the optical structure. The fault in periodicity of the structure is what leads to the localising effect in x and y of the electromagnetic field under the layer of negative dielectric permeability, at the area C.

This area C can have any profile in the plane 0xy, and is invariant along 0z. In practice, it can be obtained by different ways.

In the invention, there is provided two advantageous embodiments of an optical structure according to the invention.

A first embodiment consists of inserting between both symmetrical areas A and B, an area C having a length equal to an integer m equal to or higher than 1 of periods $\Lambda$. The areas A and B are the length of the area C away from each other. This area C can have any profile. To make its producing easier, it is substantially of the same height throughout this length.

A second embodiment consists of creating a symmetry with respect to a straight line parallel to 0y and intersecting a specific point of the pattern. The area C has then a null length. Both areas A and B intersect on the axis of symmetry $\pi$. These two advantageous embodiments are detailed infra.

The first preferred embodiment of an optical structure according to the invention is shown in 0xy cross section in FIG. 4. The optical structure is defined by a profile $h_f(x)$. This profile $h_f(x)$ includes a first area $A_1$ of periodical repetition of the unit pattern ME and a second area $B_1$ symmetrical to the first area $A_1$ with respect to the axis of symmetry $\pi$. Both sequences $A_1$ and $B_1$ have the same period $\Lambda$. They are separated by an area $C_1$, of a width l equal to an integer m not null of periods $\Lambda$. In the example shown in FIG. 4, m is 1. Sequences $A_1$ and $B_1$ advantageously include the same integer N/2 of unit patterns. Area $C_1$ is located in the centre region of the structure. The axis of symmetry $\pi$ parallel to 0y goes through the middle of the structure along 0x.

The area $C_1$ can have any profile in the plane 0xy, and is invariant along 0z. In the example shown, this area $C_1$ has an height substantially equal to the height $h_t$ of the first and third portions of the profile $h_f(x)$, that is, in this area, no etching has been carried out. Conversely, this area $C_1$ could have been etched throughout its length, such that this area would have an height substantially equal to the height $h_d$ of the second and fourth portions of the profile $h_f(x)$. More generally, this area has substantially the same height throughout its length l (namely, it has a relief substantially planar along 0xz), which is easy to carry out.

The area $C_1$ is such that it starts in a point of position $x_1$ on 0x axis substantially corresponding to the middle of a first portion $p_a$ of a unit pattern ME of said first area $A_1$ and ends in a point of position $x_2$ on 0x axis substantially corresponding to the middle of a first portion of a unit pattern of second area $B_1$.

Constructing process of such a profile $h_I(x)$ as schematically shown with m=1 in FIG. 4, means removing m periods $\Lambda$ in a periodical sequence of pattern $M_E$, between two middle points $x_1$ and $x_2$ of a portion $p_a$, and to replacing this part by any pattern, preferably an area without pattern, as illustrated.

The relative phase shift $\delta\Lambda$ between the harmonics $f(x,y,\Lambda)$ and $g(x, y, \frac{1}{2}\Lambda)$ is then substantially null.

The area $C_1$ creates a fault in periodicity of the structure. As a result, there occurs a localisation of the surface waves along 0x and 0y under this area.

Thus defined optical structure with a profile $h_I(x)$ enables the field localising in 0x and 0y to be optimized, as a function of $h_g$, a, b, c and d satisfying the equations Eq. 1 to Eq. 4.

An optical structure as shown in FIG. 4 is particularly well adapted to applications in which strong factors of surface wave quality are searched for.

It is more particularly intended to applications in narrow bands, where the frequency variance $\Delta v$ is far less than $0.1v$.

Preferably, the following relationships are chosen:

a≠c and b=d, which imposes a relative phase shift $\delta\Lambda$ being null.

This further constraint reduces the number of solutions to the previous equation Eq. 4, but enables the drawing of the optical structure according to the invention to be simplified.

The second preferred embodiment is shown in FIGS. 5a and 5b. It features a profile $h_{II}(x)$ of the relief surface of this structure. This profile $h_{II}(x)$ includes a first area $A_2$ and a second area $B_2$. The area $A_2$ is obtained by periodically repeating, at the period $\Lambda$, a particular pattern $M_{E_{XP}}$, obtained from the unit pattern $M_E$ through translation on 0x axis. The area $B_2$ is symmetrical to the area $A_2$ with respect to the axis of symmetry $H_I$. In the example, areas $A_2$ and $B_2$ each include the same number N/2 of patterns. The first area $A_2$ thus includes a number N/2 times the replica of the pattern $M_{E_{XP}}$. This pattern is defined between a point P of abscissa $x_p$ (on 0x axis) and a point P' of abscissa $x_p+\Lambda$ of a periodical sequence of the pattern $M_E$, as illustrated in FIG. 5a.

The point P of position $x_p$ is chosen so that the following equation is satisfied:

$$\int_{x_p}^{x_p+\Lambda} h(x) \cdot \sin\left(\frac{2\pi \cdot x}{\Lambda}\right) \cdot dx = 0 \qquad \text{Eq. 5}$$

Note that such an equation has two solutions.

This equation allows insuring an optimum coupling between the electromagnetic field and the luminous wave which, it should be remembered, depends on the relative phase between the two harmonics of $1^{st}$ and $2^{nd}$ order.

As shown in FIG. 5b, the second area $B_2$ is obtained by an operation of symmetry with respect to the plane of symmetry whose axis of symmetry $\pi$ only can be seen in this figure. This plane intersects 0x axis in a point S of abscissa $x_0+N/2.\Lambda$, where $x_0$ is the abscissa of the point on 0x axis corresponding to the beginning of the area $A_2$. This point S corresponds to the centre of the structure on 0x axis.

The area $C_2$ of the optical structure according to the invention is an area of null length which, in the plane 0xyz, corresponds to or merges with the plane of symmetry $\Pi$.

For parameters a, b, c, d, $h_g$ chosen by using Eq. 1 to Eq. 4, and $x_p$ chosen so that equation Eq. 5 is satisfied, the relative phase shift $\delta\Lambda$ between the first harmonic $f(x,y,\Lambda)$ and the second harmonic $g(x,y,\frac{1}{2}\Lambda)$ of the corresponding Fourier series, is substantially equal to $\Lambda/4$.

An optical structure having such a profile $h_{II}(x)$ favours a strong localization on 0x axis, in a centre area of the optical structure, which is bounded around area $C_2$.

Such an optical structure is more particularly adapted to non narrow band applications, typically with a variance $\Delta v$ of the frequency in the order of $0.1v$, or in a case where absorption into metal prevents the resonant effects upon exploiting.

An optical structure according to the invention, according to either profile described in relation to FIGS. 4 and 5b is simple to make. The manufacturing method of this structure consists in, after defining the parameters a, b, c, d and $h_g$ as described, drawing the corresponding etching, etching a layer of material, which may be any, according to the device intended for the optical structure, laying down a thin layer of a metal thereon to form the relief surface $1_b$ of the optical structure 1 as illustrated in FIG. 1. The thin layer of metal is shown in FIG. 1 by the bold line. The relief surface can be further directly carried out by etching in a layer of doped semi-conductor, so that its dielectric permeability is negative. The relief surface is located on one side into contact with the medium of positive dielectric permeability, which may be vacuum or a semi-conductor type material.

If the medium of positive dielectric permeability is vacuum, then the optical structure will generally be supported by any substrate.

If the medium of positive dielectric permeability is a semi-conductor material, then the optical structure could be protected by a protecting layer, for example a dielectric layer, or could be exposed to the open air.

Regarding the dielectric permeability, it could be noted that, in all conductors, the dielectric permeability changes of sign: it is negative at a low frequency and positive at a high frequency. The transition frequency, called plasma frequency in the literature, depends on conductibility. Metals have thus their plasma frequency in the ultraviolet range. The plasma frequency of semi-conductor materials depends on doping. It is generally in the far infrared domain (wavelength greater than 30 microns). If semi-conductor materials are strongly doped, they may come close to the plasma frequency of metals. That is the way a relief surface of the optical structure according to the invention can be made in a metal or very strongly doped semi-conductor material.

Finally, as clearly understood from above, the negative or positive dielectric permeability referred to in the invention, is regarded with respect to the operating spectral domain of the device embodying the structure, that is the wavelength of the incident optical radiation that is to be detected or the wavelength of the optical radiation emitted from the device.

Different applications of an optical structure according to the invention will now be described, according to either one of the embodiments previously described. In these applications, the optical structure is defined by its areas A, B and C as described supra.

FIG. 6 shows a photo-detector 10, including an optical structure 30 according to the invention. In the example, this structure has a relief surface having a profile of the type $h_I(x)$.

In this device 10, the medium of positive dielectric permeability is a semi-conductor type material. It provides an electrical signal corresponding to the detection of an electromagnetic wave, by means of an active optical member 21 for the purpose of photodetecting. In particular, quantum well type photodetectors are used to detect an infrared radiation with wavelengths between 1 and hundreds of micrometers.

The photo-detector 10 substantially includes, according to the illustration in a cross sectional view in the plane 0xy:
- an optical structure 30 according to the invention,
- a semi-conductor substrate 11 supporting the photo-detector, transparent to the optical radiation L that is to be detected;
- an active optical member, which is a photodetecting area 21 made in a semi-conducting layer 20, provided in the centre with respect to the area C of the optical structure, and that provides an electrical signal corresponding to the detection of an electromagnetic wave of a wavelength determined,
- the period Λ of the optical structure 30, multiplied by the refractive index of the layer 20 including the active optical member is chosen close to the wavelength.

The optical structure 30 includes a layer 31 that is etched and covered with a metal film 32, shown with a bold line, which provides the relief surface being searched for, for example of the type $h_I(x)$ or $h_{II}(x)$. In the illustration of FIG. 6, it is the profile $h_I(x)$. Etching of the layer 31 is such that the metal layer 32 is contacting the conducting layer 13. By way of non limiting example, the layer 31 is a layer of dielectric material and the metal 32 is gold or palladium. The depth of the metal layer is a few tens of nanometres, greater than the skin depth of said metal in the operating spectral domain being considered, in order to prevent the radiation L to be transmitted. The optical structure 30 can further include a layer of dielectric material 33, that covers the layer 32, so as to provide protection for the structure.

The choice of the profile between $h_I(x)$ and $h_{II}(x)$ depends on properties wanted for photodetection, in particular, but not only, if the operating spectral band must be of narrow band ($h_I(x)$) type or of wide band ($h_{II}(x)$) type.

It is noted that in such a detecting device provided with an optical structure of the invention, the amplitude α of the first harmonic defines the coupling and the amplitude β and the relative phase shift δΛ define the localisation along 0x and 0y.

In an alternative not represented, the optical structure 30 is made in a strongly doped semi-conductor layer, for the purpose of providing a negative dielectric permeability in the operating spectral domain of the photodetector, whose upper face has the relief according to the invention, with for example a profile of $h_I(x)$ or $h_{II}(x)$ type.

The photodetecting area 21 is surrounded by a peripheral area 22 inactive at the wavelength considered. It has x and z dimensions chosen to substantially correspond to the localisation of the electromagnetic field in x. In the case of a structure of $h_I(x)$ type, the x dimensions of the photodetecting area 21 substantially correspond to the length of the area C.

The photodetecting area is located in the vicinity of relief surface of the optical structure, to optimize the detection. Indeed, the amplitude of the electromagnetic field decreases from the relief surface to the substrate.

In practice, the electrical contact areas 51 and 52 which enable the electrical signal from the area active to be detected are provided. To that end, as illustrated for example, a doped semi-conducting layer 13, between the semi-conducting layer 20 and the optical structure 30, and a doped semi-conducting layer 12 between the semi-conducting layer 20 and the substrate 11, are provided. The electrical contacts 51 and 52 are then taken on these conducting layers 12 and 13 which are doped semi-conducting layers sandwiching the active area.

The layers or areas 11, 12, 22, 13 and 31 are chosen to be transparent in the operating spectral domain of the photodetector, all of them provide a positive dielectric permeability $\in_r$ for the spectral domain in which the photodetection proceeds, typically the infrared domain. It is known that the different semi-conductor layer 11, 12, 20, 13 of the device are, for example, materials from family III-V.

The photo-detector including an optical structure according to the invention is operating as follows. The light beam L to be detected illuminates the photo-detector by the substrate 11, under an incidence close to the normal. This beam goes through the substrate 11, the conducting layer 12 and the semi-conducting layer 20 including the photodetecting active area 21, without any sensitive attenuations. It reaches the optical structure 30, causing a surface wave in magnetic transverse bias to be excited, that is to say whose electrical field is perpendicular to the network. The optical structure also serves to localise the luminous beam it picks up, in a centre area corresponding to the photodetecting area 21. Therefore, the signal to noise ratio is improved, which is aimed at.

An optical structure according to the invention enables a photodetecting area of small dimensions to be provided, corresponding in practice to a small region beneath the area C. The luminous beam picked up by the device is localised in this photodetecting area. The signal to noise ratio is improved.

In a quantum well type photodetector, limiting the dimensions of the quantum well photodetecting area 21 can imply:
- neutralizing the quantum wells in the peripheral area 22, by implanting protons for example;
- limiting the current in an area 14, 15 of the conducting layer 13 corresponding to the peripheral area 22, by neutralizing doping in these areas 14, 15, for example by implanting protons.

An alternative to a photodetecting device according to the invention is represented in FIG. 7. In this alternative, the active optical member is provided above the area C and not beneath any more, in order to take advantage of optimum detecting conditions. Indeed, by placing the active optical member above the area C, this member sees a constant amplitude of the electrical field, corresponding to the maximum amplitude.

Implementing this alternative requires an optical structure whose area C of the relief surface has a non null length, that is with a profile of $h_I(x)$ type.

A corresponding photodetector (FIG. 7) includes an optical structure 110 including a doped semi-conductor layer 111 of positive dielectric permeability, and a first layer 112 and a second layer 113 of a material of negative dielectric permeability.

The layer 111 is etched so as to have a reverse relief surface with respect to the profile $h_I(x)$ (FIG. 4).

The first layer 112 of a material of negative dielectric permeability covers the relief surface of the layer 111, so that the area C is formed by a hole in this layer. The active optical member 120 is directly provided into contact with layer 111, this layer 111 being at a level $h_c$ above the first layer 112 in the third area C, with a height $h_c$ higher than those of the portions $p_a$ and $p_b$ of the profile according to the invention.

The second layer 113 of a material of negative dielectric permeability is provided above the active optical member, and electrically isolated from the first layer 112.

The first and second layers 112 and 113 provide a first electrical contact 150 and a second electrical contact 151, respectively, to deliver the photodetecting electrical signal.

The active optical member 120 is a photodetecting area provided above the layer 111, on the area C. It is thus situated at a height $h_c$ above high portions $p_a$, $p_c$ of the profile $h_I(x)$ (FIGS. 1, 4)). In this way, it is possible to make the electrical contacts with which the photodetecting signal is recovered, without the risk that metal layer directly contacts the photodetecting area 120.

In practice, the corresponding optical structure needs then two succeeding etching operations, a first etching to a depth $h_{g1}=h_c-h_r$, throughout the surface of the doped semi-conductor layer, except inside the area C. Then, a second etching to a depth $h_{g2}=h_r-h_d$ is carried out according to the drawing of the unit pattern $M_E$.

More precisely, in the exemplary embodiment illustrated in FIG. 7, the device includes a substrate 100, the optical structure 110 including the doped semi-conducting layer 111, and the layers 112 and 113, a photodetecting area 120, of dimensions in the plane of surface 0xz limited to the dimensions of the area C, provided thereover into contact with layer 111 in the area C and centred on this area C. The layers 112 and 113 are metal layers, for example gold.

Since layer 111 forms a layer contacting the photodetecting area 120, then metal layer 112 forms a corresponding electrical contact 150.

A doped semi-conductor layer 130 is provided on the photodetecting area 120, to form a second layer contacting this area 120. This layer 130 is covered with the metal layer 113, which provides another electrical contact 151. The photodetecting signal of the device is obtained across the terminals of both electrical contacts 150 and 151.

In practice, a dielectric layer 140 is provided to laterally isolate the photodetecting area 120 from the metal layer 113 and isolate the contacts 150 and 151.

Such a device has very interesting photodetecting qualities of an illumination L, because the photodetecting area 120 is positioned above the localising area in x and y of the field. Indeed, the surface electrical field under an optical structure according to the invention decreases from the relief surface of the material of negative dielectric permeability to the material of positive dielectric permeability, being below. From the relief surface of the material of negative dielectric permeability and above, the electrical field has a constant value. In particular in the photodetecting area 120 of the structure, the values of the field are maxima, in virtue of the field concentrating effect area C. Therefore, the photodetecting area yields a stronger covering of the field. The detecting performance is improved. However, this is obtained at the expense of a little more complicated manufacturing, in particular with more etching steps. On the other hand, no proton implanting steps are required any more to produce a device as illustrated in FIG. 6, to bound the photodetecting area.

The optical structures used in the devices just described in relation to FIGS. 6 and 7 have a further advantage in that a single etching step of the profile $h_I(x)$ or $h_{II}(x)$ is required for producing them, following technological steps comparable with those used to produce quantum wells. Thus, an optical structure according to the invention is advantageously applicable to QWIP (Quantum Well Infrared Photodetector) type photodetectors.

The invention is also applicable to other types of photodetectors, like for example inter-band detectors or photoconductors based on material families containing Gallium Antimonide (GaSb) or Mercury Cadmium Tellurium (HgCdTe).

The optical structures according to the invention can be used in photodetectors whose detecting spectral domain is other than the medium infrared. In particular, it can be used in the microwave field (frequencies in the order of gigahertz), or far infrared field (frequencies in the order of terahertz) or further near infrared field.

The invention is also applicable to photosensitive matrices including a plurality of photodetectors each including an optical structure according to the invention, these photodetectors being disposed in rows and columns on a common support, according to the principles of making the photosensitive matrixes well known to those skilled in the art.

Another application of an optical structure to a semi-conductor device according to the invention relates to the emitters.

Figure 8B:
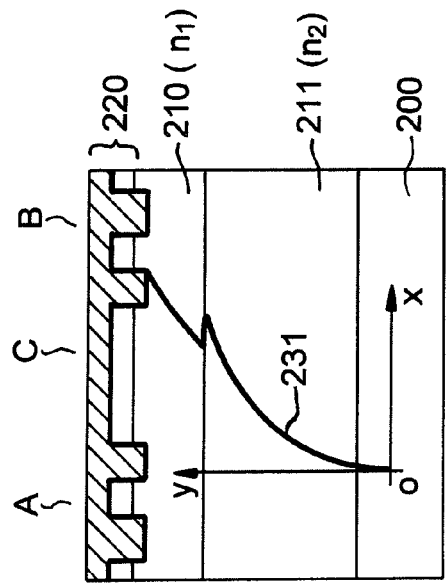
FIGS. 8a to 8c show a light wave emitting device including an optical structure according to the invention.
Figure 8A:
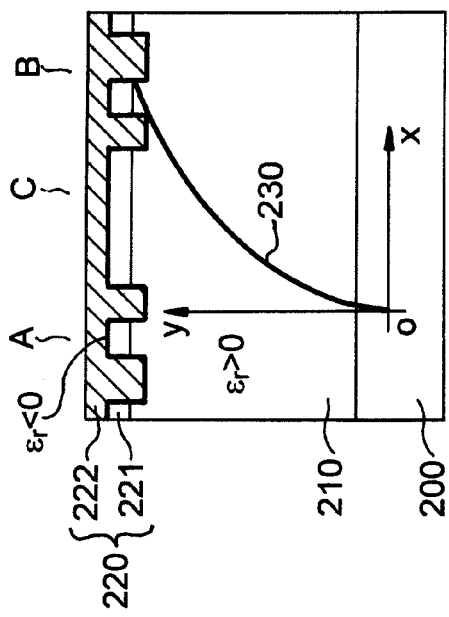

A first exemplary device provided with an optical structure according to the invention, to emit a luminous beam in a given operating spectral beam, for example the medium infrared, is illustrated in FIG. 8a. More particularly, it is a quantum cascade emitter type device.

A quantum cascade emitter of the state of the art includes semi-conducting layers, mainly a substrate and an active layer, and a metal layer on the active layer. The active layer forms a waveguide from which is extracted, through the wafer, the luminous wave generated under the effect of the electrical excitation applied by the metal layer. A feature of such a device is as follows: the active layer emits with a bias perpendicular to the plane of the semi-conducting layers. For this reason, extracting the luminous beam is difficult.

In the invention, the semi-conducting structure of such an emitter and an optical structure according to the invention are combined. Namely, the metal layer is replaced by an optical structure according to the invention, including a metal layer having a relief surface according to the invention contacting the semi-conducting structure which forms the medium of positive dielectric permeability $\in_r$.

The laser mode emitted by a quantum emitter is indeed a TM mode. This mode is compatible with surface plasmons. Accordingly, it is possible to use an optical structure according to the invention with such an emitter.

In particular, the effect of this combining is to improve the optical field localising and to allow a vertical extraction of the laser beam, through the substrate surface, which solves the extraction related problems.

An embodiment of such a quantum cascade emitter is illustrated in FIG. 8a. The device includes a substrate 200, an emitting active area 210 and an optical structure 220 according to the invention. The period $\Lambda$ of the optical structure is chosen so that its value multiplied by the optical refractive index of the layer 210 forming the active area is close to the wavelength of the emitted beam.

The emitting active area 210 is a layer allowing an optical gain. For example, it is an active structure of quantum cascade laser, such as for example described in patent EP 1466393.

The optical structure 220 at least includes a first layer 221 semi-conducting doped transparent to the wavelength of emission and a second metal layer 222 non transparent to the wavelength of emission. The first layer has a relief surface along a profile h(x) according to the invention, profile that can be of the type $h_I(x)$ or $h_{II}(x)$. The second layer 221 covers this relief surface. The layer 221 is etched so that the layer 222 contacts the emitting active area 210, possibly enters the active area as illustrated in FIG. 8a. Therefore, there is obtained a layer of a material of negative dielectric permeability, the layer 222, having a relief surface according to the invention contacting the medium of positive dielectric permeability which is the semi-conducting structure and which includes the emitting active area 210.

Semi-conducting materials used in the device are typically materials of family III-V.

The profile of the relief surface is more particularly defined by its parameters a, b, c, d, $h_g$ for the amplitude $\alpha$ of the first harmonic $f(x,y, \Lambda)$ to be far less than the amplitude $\beta$ of the second harmonic $g(x, y, \frac{1}{2}\Lambda)$, so as to favour localising. Coupling must indeed not be too high, otherwise the laser effect disappears. More generally, these amplitudes are chosen to obtain the laser effect.

The parameter $h_g$ is more particularly chosen depending on the length of the device considered and on the available gain. It is optimised resorting to an accurate electromagnetic modelling in a well known manner.

Thus, the operating principle is the detection of the field and the vertical emission of a luminous radiation L as illustrated in FIG. 8a. the way the optical mode in the device is developing is represented under the reference 230 in FIG. 8a.

To take the example of a laser, we can obtain with only one step more than the prior art:
  a vertical localisation, along 0y, of the electromagnetic mode;
  a laser cavity along the plane 0xz of the layers, without the need for cleavage (since there is no more extraction through the wafer, but vertical extraction), in a region bounded under the area C (or around the area C when it has a null length, in the case of the profile $h_H(x)$), where the optical field is strongest;
  a very good extraction of the radiation, with a collimated and weakly diverging laser beam L in the vertical direction (emission by the lower surface of the substrate).

The optical structure according to the invention can also be used in the case of a device using one or more strongly doped layers (Plasmon enhanced) as illustrated in FIG. 8b. At least one further layer 211 is then provided between the substrate 200 and the active layer 210. This layer 211 is strongly doped, more strongly doped than the active layer 210 so as to obtain with the latter a strong contrast of refractive index, required for localising the optical field. This layer 211 thus has an optical index $n_2$ lower than the optical index $n_1$ of the active layer 210. Such an hetero-structure 210, 211 is used in the state of the art to reduce absorption losses in the metal layer. The reference 231 in FIG. 8b represents the way the optical mode in layers 210 and 211 is developing.

Such a device is used in particular to produce quantum cascade lasers operating in the medium infrared. Localising is improved.

Figure 8C:
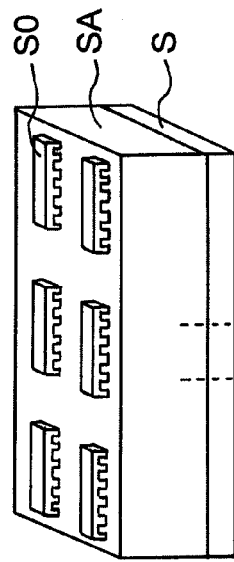

Since the technological implementation is simple, it is applicable to produce a plurality of emitters on a same support, for producing a network, as schematically illustrated in FIG. 8c. Hence, there is a substrate S and an active structure SA including an active layer and possibly other semi-conducting layers (hetero-structure), and on this active structure, a plurality of optical structures SO according to the invention, matricially disposed into rows and columns, forming as many unit emitters as optical structures. These emitters have an advantage in that they can be synchronized, and controlled in particular to control the direction of every unit laser beam emitted, in order to output a single laser beam L (electronic beam scanning).

The invention is not limited to an emission in the infrared spectral domain, but is applicable to a wider spectral domain, depending in particular on materials used, and on the structure of the device.

Figure 9:
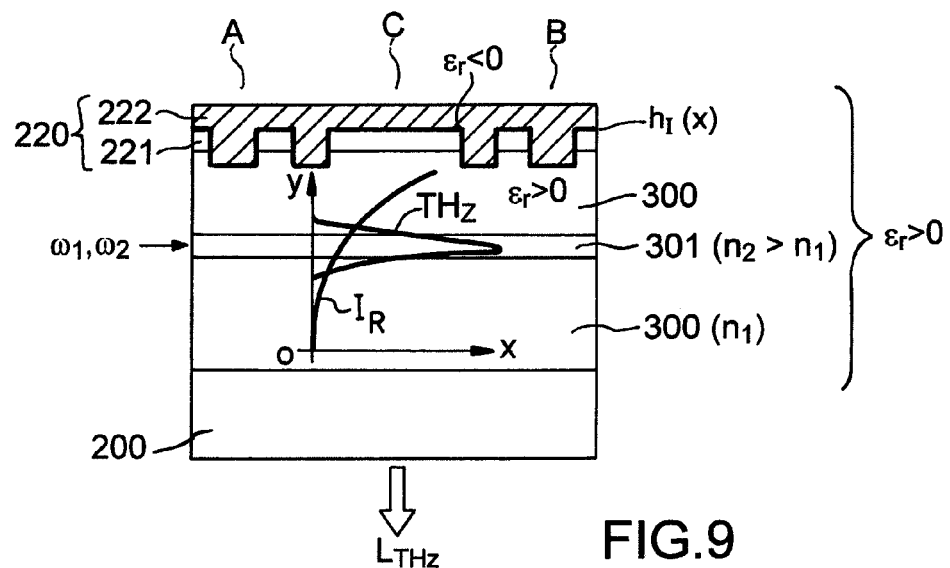
FIG. 9 shows a terahertz wave emitting device by frequency conversion including an optical structure according to the invention.

In particular, it is applicable in the field of generating terahertz waves (that is at a wavelength between 70 and 300 micrometers), as illustrated in FIG. 9, and very advantageously as compared with the state of the art.

According to the state of the art, generating terahertz waves can be obtained through optical frequency converting, by means of a non linear medium of $2^{nd}$ order, including a non linear optical layer, in which a non linear waveguide is produced, with a material having a higher optical index. This waveguide is illuminated at one end, through the wafer of the device, by two laser sources providing two optical frequencies $\omega_1$ and $\omega_2$. The non linear interaction of both optical frequencies causes a terahertz wave at the frequency difference to be emitted. The waveguide must be a medium transparent in the near infrared and terahertz domain. In one example, semi-conductors of family III-V are for example used such as growing GaAs [1 0 0], both optical frequencies of the near infrared domain being biased along 0x and the terahertz wave being biased along 0y (TM mode).

In practice the structure of the device must enable guided Terahertz mode and optical frequencies to be phase matched. The phase matching frequency does not depend on inherent properties of the non linear material. For example, with GaAs, the phase matching is only possible with optical frequencies well defined around 1.2 micrometers. For these reasons, the choice for laser sources is limited.

Localising the field mainly depends on the index contrast, and growing possibilities of materials.

In practice, there are problems for localising the generated wave because the possibilities of index contrast given by semi-conductors are limiting, like is in particular the growing technology of semi-conducting materials.

This aspect can be improved by using doped layers on either side of the waveguide. A structure generating terahertz wave through index contrast according to the state of the art thus includes a semi-conducting membrane coated with metal on both faces. Such a structure is particularly delicate to be produced, and gives rise to a problem for extracting the light: indeed both metal faces result in an impedance mismatching between the active layer field, and the free space, and hence in terahertz wave reflection issues. This mismatching problem between the waveguide and the free space makes the extraction more difficult.

By using an optical structure according to the invention, the phase matching condition can be satisfied more independently from the properties of the materials, by exploiting the periodicity induced dispersion. Moreover, containment and extraction issues are solved: localising the field near the metal surface of the optical structure solves the light containment issue: containment is no longer provided by the index contrast but by the geometry of the optical structure, the containment degree being controlled by the amplitude of the second harmonic corresponding to the profile of the structure. And a second metal layer is no longer needed. Finally, the terahertz wave is emitted through the surface.

In the invention, an optical structure according to the invention is applied to such an emitter (FIG. 9), with such a period Λ that its value multiplied by the average refractive index of the emitter layers is substantially close to terahertz wavelength which is desired to be generated.

We can thus obtain a device whose medium positive dielectric permeability is the semi-conducting structure of the emitter.

This structure mainly includes an active optical member, formed by a non linear material layer 300, transparent to wavelengths of the near infrared and terahertz domains. This layer includes a non linear semi-conducting waveguide 301 also transparent to wavelengths of the near infrared and terahertz domains.

Non linear semi-conducting materials are typically chosen from family III-V such as GaAs, or AlGaAs for example. For the waveguide 301, one of the crystallographic axes [110] or [−110] is oriented along 0x.

The waveguide is formed by a layer of a material whose positive dielectric permeability is higher than that of the active layer 300.

The optical structure is disposed on the layer 300. The optical structure is in the example identical to that seen in FIGS. 8a and 8b. The metal layer 222 comes into contact with the layer 300, possibly enters the layer 300 as illustrated. The profile of the relief surface is more particularly defined by its parameters a, b, c, d, $h_g$ for the amplitude α of the first harmonic f(x,y, Λ) to be far less than the amplitude β of the second harmonic g(x, y, ½Λ), so as to favour localising.

The thus formed device allows a vertical emission of a terahertz wave $L_{THZ}$ generated by conversion of optical frequency, in response to an illumination of the waveguide along the 0x axis under two optical frequencies $\omega_1$ and $\omega_2$ different from the near infrared domain.

The device performance is improved. In particular, the optical structure enables to obtain:

a localization of the terahertz field generated in TM bias, without to the need of doped layers or two metal layers; therefore, making the device is much simpler;

a resonant cavity for this field, because its size is finite, typically in the order from 1 millimetre to a few millimetres along 0x, corresponding to the containment of the electromagnetic field into a volume bounded along 0z, by the width of the structure, along 0x, by the length of the structure, and along 0y, because a surface wave exists.

a modification of the dispersion in the terahertz domain, which enables phase matching to be adjusted. That is what enables to choose laser sources best suited to the application, whereas in the state of the art, the choice is limited to the phase matching condition. Freedom of action is thus made easier by use of an optical structure according to the invention.

In a more detailed exemplary embodiment, as illustrated in FIG. 9, the device then includes:

a semi-conducting substrate 200, for example GaAs.

an non linear layer 300, for example of a material such as $GaAs$, $Ga_xAl_{1-x}As$, $Ga_xIn_{1-x}P$, ...

a non linear waveguide 301 in the near infrared, made in the layer 300, for example, a layer of a thickness in the order of the micron, and of optical index $n_2$ higher than optical index $n_1$ of the layer 300. For example if the material of this layer 300 is $Ga_xAl_{1-x}As$, then the waveguide can be made with GaAs.

The profile of the guide mode in the near infrared, written as IR in the figure, and that of the terahertz mode, written as THZ have been represented.

We can obtain a terahertz radiation $L_{THZ}$ that vertically exits by the surface of the substrate 200.

A terahertz emitting system including a series of devices of this kind, aligned on a same substrate can be considered.

Another application field of an optical structure according to the invention, relates to electron sources, and more particularly sources using cold cathodes with emitting tips. In this context, the cathode is of the field emission type. According to the state of the art, each emissive area of the cathode comes as a cone (for example of tungsten) or as a tip (for example a carbon nanotube or a metal or semi-conducting nanowire). Such a cathode includes a great number of emitting tips, from which the corresponding structure is called FEA, acronym for Field Emission Array.

A corresponding electron source includes a FEA cathode and a gate spaced apart from each other (typically from 1 to a hundred μm), and between which prevails a more or less high vacuum. A voltage applied to this gate, in the order of some tens to some hundreds of volts, enables an external electrical field E strong at the surface of each tip of the cathode to be created. The cathode emits a constant electron flow, which is extracted therefrom by the external electrical field.

A modulation of the voltage or of the electrical field E causes a modulation of the current density J of electrons emitted according to the Fowler-Nordheim's law:

$$J = k_a E^2 \exp\left(-\frac{k_b}{E}\right) \text{ where } k_a \text{ and } k_b \text{ are constants.}$$

Figure 10A:
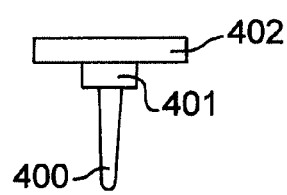
FIGS. 10a to 10f show a field emission device including an optical structure according to the invention.

It is interesting for several applications to generate this modulation of emission through an optical control. For this, it has been provided (French patent 04 13340) as schematically illustrated in FIG. 10a, to dispose a photoconducting member 401 between each emitting tip 400 and the conducting substrate 402 of the cathode (configuration 1). The photoconducting member can be a diode, typically a PIN diode or a semi-conducting resistor. In another configuration illustrated in FIG. 10b (configuration 2), the photoconducting member forms part or all of the emitting tip 400. The tip can then typically include a nanowire or nanotube of a photosensitive conducting material. Since the cathode/gate set is biased by a constant voltage under a significant emission threshold, modulating the illumination L results in modulating the impedance or the current in the photoconducting material, and hence the current emitted by the tip.

In the case of tips with nanometric diameter at the top, it has also been provided another configuration, according to which the electrical field of the optical wave in the surroundings close to the tip is used to have a direct influence on the "field emission" of the electrons from the top of the tip, thanks to the non linear characteristic of the field emission process (optical rectification effect). By modulating the illumination intensity, it is possible to modulate the density of the current emitted (configuration 3). Refer for example to the article by M. Hagmann edited in IEEE Transaction on Microwave Theory and Techniques review, Vol. 52 no 10, October 2004.

Finally, another configuration is provided in this article (configuration 4), according to which the beating of two optical waves of wavelengths very close to each other is used to make up a resultant optical wave whose amplitude is modulated at a frequency near THz, and to cause this wave to interact with the emitting tips as just said. The purpose is then to make up electron beams modulated at a frequency THz to enable amplifier tubes or power oscillator to be produced in this frequency range.

In the optically controlled devices just described, a major part of the control luminous energy is lost in the case of a uniform illumination, because the photosensitive members are small and spaced apart. On the other hand, in the case of direct modulation of emission by the electrical field of the optical wave (configurations 3 and 4), the illumination usually in quasi-normal incidence, corresponds to an electrical field of the optical wave perpendicular to the axis of the tips, being an inefficient orientation to have an influence on the field emission.

The invention provides a solution to these different problems.

A configuration of a field emission device including an optical structure according to the invention is illustrated in FIGS. 10c to 10f.

The medium of positive dielectric permeability $\in_r$ is made up with vacuum ($\in_r=1$).

An optical structure according to the invention is used, with a layer 500 of negative dielectric permeability having a relief surface contacting the vacuum ($\in_r=1$).

The active optical member herein is an electron emitter, typically an emitting tip.

An emitting tip 510 is placed on the relief surface of the layer 500, in the localising area in x and in y of the electrical field, that is in the area C, or when it has a null length (profile $h_H(x)$), in a region close to the plane of symmetry.

We can obtain, through the coupling effect of the incident wave to a surface mode, a re-orientation of the electrical field of the optical wave, which becomes parallel to the axis of the emitting tip.

Figure 10B:
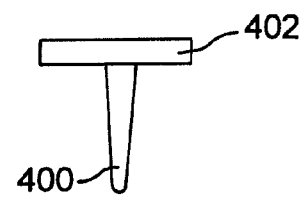
Figure 10C:
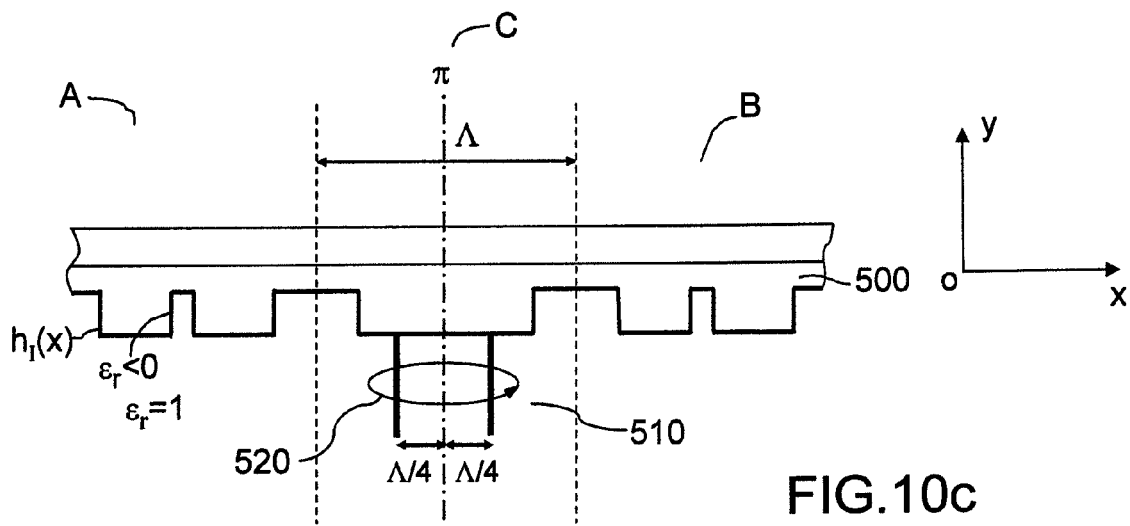
Figure 10D:
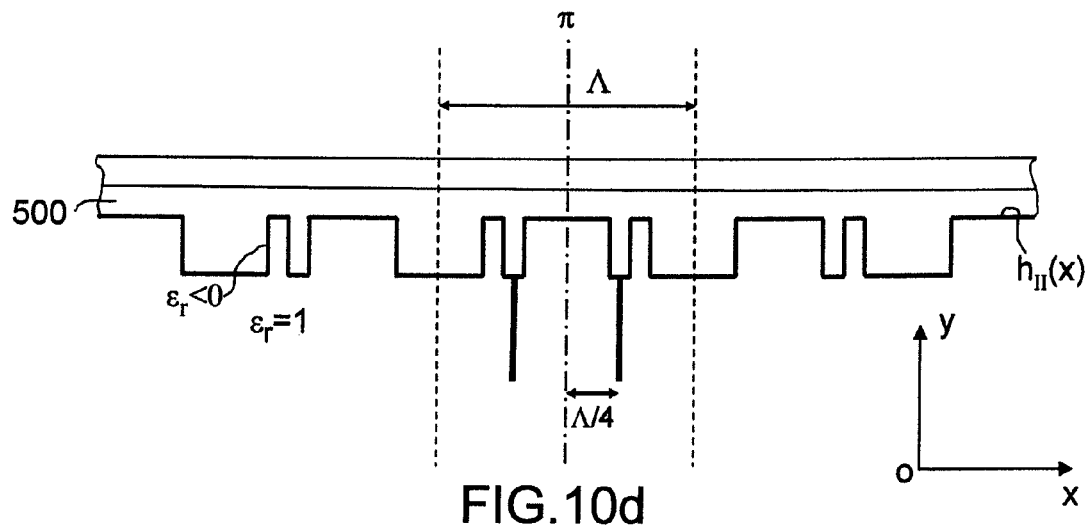
Figure 10E:
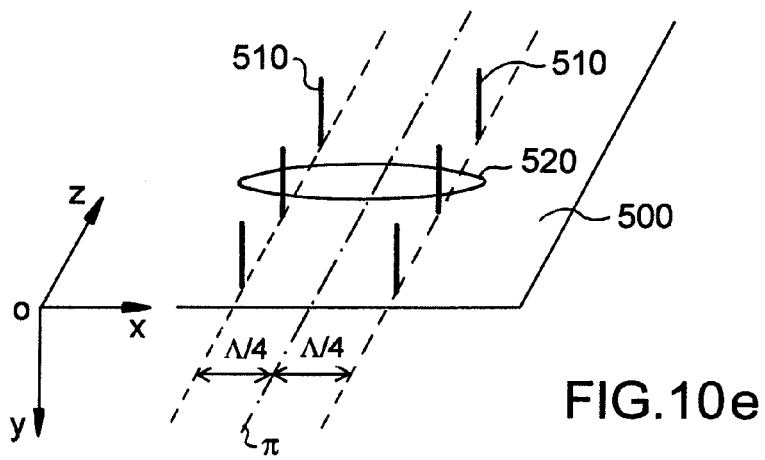

The invention enables the modulation of electron emission in the four known configurations 1 to 4 described above to be drastically increased. More precisely, by using an optical structure according to the invention, there can be obtained the excitation of an optical field biased along the axis of the tips from a beam with a quasi-normal incidence. Optical modulation is thus very easy to be implemented in the electron source device More precisely, as illustrated in FIG. 10c, a field emission device includes an optical structure, including at least a layer of negative dielectric permeability 500 having a relief surface according to the invention, contacting the vacuum. The period $\Lambda$ of the optical structure is close to the wavelength of the optical wave controlling the field emission.

The emitting tips 510 are oriented along −0y. These tips can be partly or totally made of photoconducting material, as illustrated in FIG. 10b, or include at the bottom, between the layer 500 and the tip itself, a photosensitive conducting member as illustrated in FIG. 10a, for example a photodiode or a photoconducting resistor.

These tips are disposed on the layer 500, in the field localising area in x and y.

Preferably, they are disposed close to the point of maximum amplitude of the component Ey of the field. This can vary depending on the profile of the relief surface, and of the parameters a, b, c, d, $h_g$ of the unit pattern.

It is shown that a location of the tip 510 at a distance along 0x in the order of $\Lambda/4$ on any side of the plane of symmetry $\Pi$ yields a good performance. There can also be provided a pair of tips 520, with a tip at a same distance on either side from the plane $\Pi$, and preferably at a distance close to $\Lambda/4$ from this plane, as illustrated in the configuration shown in FIG. 10c, with a relief surface of $h_i(x)$ type, or in FIG. 10d, with a profile of $h_H(x)$ type.

Since the structure is invariant along 0z, the tips 510, or pairs of tips 520 are disposed, aligned along 0z (FIG. 10e) on the relief surface of the layer 500.

Figure 10F:
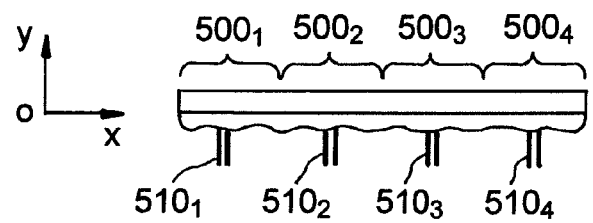

Further, it can be produced a matrix of electron emitters, with as many optical structures $500_1$, $500_2$ . . . as rows of desired tips $510_1$, $510_2$, or pairs of tips $520_1$, $520_2$, as schematically illustrated in FIG. 10f. These optical structures $500_i$ are advantageously contiguous, to prevent light losses between these structures.

In an alternative of the invention, under the location of the tips, there is a photoconducting device (PIN or else) directly on the substrate which can then be advantageously a very doped semi-conductor, according to the configuration of the FIG. 10a.

An advantageous implementation of the invention includes using nano-emitters such as semi-conducting nanowires or nanotubes as electron emitting tips. these nano-emitters have indeed a very favourable shape factor, which results in a local electrical field at the end of these nano-emitters being increased by at least two orders of magnitude, with respect to the average field. This allows an efficient electron emission, under weak electrical fields applied.

In an advantageous embodiment, the profile of the structure is parametered so as to be very resonant. This strong resonance enables a surface electromagnetic field whose amplitude can be higher by at least one order of magnitude than the amplitude of the incident optical field, to be obtained. This implies a contribution to the electron current emission that is at least of two orders of magnitude.

Advantageously, through the optical rectification effect, the optical structure according to the invention also enables a beating signal between two optical frequencies to be converted into a modulation in THz domain of the electron emission. The electron source then includes two optical sources, typically two laser sources emitting at near frequencies.

According to an advantageous aspect of the invention, since the optical structure enables the electrical field in the vicinity of nano-emitters to be increased, the optical intensity is also increased, typically of a factor from 100 to 1000. As a consequence, the photoconductivity of the nano-emitter is modulated.

In a practical exemplary embodiment, a field emission device according to the invention could be made the following way.

A substrate is provided, that can be a semi-conducting or metal material. The optical structure according to the invention is made. For example, a layer of dielectric material is laid down, and then etched according to the suitable profile. Then, the metal layer is laid down. For example, the metal is gold.

On the optical structure thus made, a resin layer is laid down, and etched at the location intended for each emitting tip 510, so as to release this area to lay down a material compatible with the emitting tip therein. In one example, if the tip is a carbon nanotube, a diffusion barrier is made, typically a TiN deposit, and a catalyst (Ni, Co, Fe . . . ) on the fault area. Then, the carbon nanotube can be grown through CVD.

This tip can also be a semi-conducting nanowire (or a plurality of nanowires). This tip is laid down by any suitable means according to the state of the art, on the fault area, on which a material compatible with the nanowire had been laid down beforehand.

The invention that has been described is not limited to the only structures and applications that have been given by way of examples.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. Device including at least one active optical member provided in a medium of positive dielectric permeability and, in the proximity of said active member, an optical structure including a layer of a material of negative dielectric permeability, said layer having, located in an orthogonal reference frame 0xyz, a surface having a relief y=h(x,z) invariant along 0z and variable along 0x, the 0y axis being oriented from the positive dielectric permeability medium to said layer of negative dielectric permeability, said surface contacting said positive dielectric permeability medium and including a first relief area, having a profile in 0xy cross section that includes a periodic repetition of a unit pattern and a second relief area symmetrical to said first area with respect to a plane of symmetry parallel to 0yz, said first and second areas being separated by a third layer provided in the centre of the structure, giving rise, compared with said first and second areas, to a fault in periodicity of the relief surface, wherein said unit pattern is defined by four succeeding portions, a first portion of full width at half maximum a and a second portion of full width at half maximum b, a third portion of full width at half maximum c and a fourth portion of full width at half maximum d, said first and third portions having substantially the same height $h_t$, said second and fourth portions having substantially the same height $h_d$ different from $h_t$, with $h_t$ strictly higher than $h_d$ and in that a, b, c, d and $h_g = h_t - h_d$ are selected profile parameters such that:
- each of them is not zero,
- the sum a+b+c+d is equal to the period Λ and
- at least a≠c or b≠d.

2. Device according to claim 1, wherein said portions form a binary pattern.

3. Device according to claim 1, wherein said third area has a length (l) equal to a non zero integer m of periods Λ.

4. Device according to claim 3, wherein said third area has a relief substantially planar along 0xz throughout its length and in that the parameters a, b, c and d satisfy the following relationships:
- a≠c and
- b=d.

5. Device according to claim 1, wherein said third area has a null length along 0x.

6. Device according to claim 5, wherein said first area and second area are such that:
the first area includes a number N/2 times the replica of a pattern, said pattern being defined from a periodical sequence of the unit pattern between a point of position $x_p$ on the 0x axis and a point of position $x_p+\Lambda$ on the 0x axis, said point of position $x_p$ being such that the following equation is satisfied:

$$\int_{x_p}^{x_p+\Lambda} h_{II}(x) \cdot \sin\left(\frac{2\pi \cdot x}{\Lambda}\right) \cdot dx = 0$$

where $h_{II}(x)$ is the height along 0y of the profile in a point x of the interval $[x_p, x_p+\Lambda]$;
the second area is obtained through duplicating the first area following a symmetry operation with respect to said plane of symmetry;
and in that said unit pattern can be described by a Fourier series with complex amplitudes, the parameters a, b, c, d and $h_g$ being chosen so that:
between an harmonic of first order $f(x,y,\Lambda)$ and an harmonic of second order $g(x,y,\frac{1}{2}\Lambda)$ of said Fourier series, there is a relative phase shift δΛ substantially equal to Λ/4 and
the complex amplitude of at least one harmonic from the harmonics of order higher than two, is negligible with respect to the complex amplitudes of the harmonics of first order $f(x,y,\Lambda)$ and of second order $g(x,y,\frac{1}{2}\Lambda)$.

7. Device according to claim 1, wherein:
said medium of positive dielectric permeability is a semiconductor type material;
said active optical member is a photodetecting area provided in a layer of said material, centred with respect to said third area, able to provide an electrical signal corresponding to the detection of an electromagnetic wave of a determined wavelength, and
the period Λ of the optical structure, multiplied by refractive index of said layer, is close to said wavelength.

8. Device according to claim 7, wherein said wavelength belongs to an infrared domain.

9. Device according to claim 8, wherein the optical structure includes a doped semi-conducting layer of positive dielectric permeability, and a first layer and a second layer of a material of negative dielectric permeability, said first layer having a relief surface in which the third area is formed by a hole in this layer and in that the active optical member is directly provided on said layer of doped semi-conducting material, said layer being at a level above the first layer in this third area and second layer of a material of negative dielectric permeability being provided above the active optical member, and electrically isolated from the first layer.

10. Photosensitive matrix including a plurality of photodetectors, wherein said photodetectors are devices according to claim 7.

11. Device according to claim 1, wherein:
the medium of positive dielectric permeability is a semiconductor type material,
said active optical member is an active layer of said material allowing an optical gain and a laser emission,
the period Λ, multiplied by the refractive index of the layer 20, is close to the wavelength emitted,
said device allows a vertical extraction of the laser emission.

12. Device according to claim 3, wherein the parameters a, b, c, d and $h_g$ of said optical structure are chosen so that the second harmonic of $2^{nd}$ order $g(x,y,\frac{1}{2}\Lambda)$ of Fourier series associated to the profile of the unit pattern has a complex amplitude β much higher than the complex amplitude α of the harmonic of $1^{st}$ order $f(x,y,\Lambda)$;
wherein said third area has a length (l) equal to a non zero integer m of periods Λ;
wherein said third area starts in a point of position $x_1$ on the 0x axis substantially corresponding to the middle of a first portion of a unit pattern of said first area and ends in a point of position $x_2$ in the 0x axis substantially corresponding to the middle of a first portion of a unit pattern of said second area, and wherein said unit pattern (ME) can be described by a Fourier series with complex amplitudes, the parameters a, b, c, d and $h_g$ being chosen so that:
between an harmonic of first order $f(x,y,\Lambda)$ and an harmonic of second order $g(x,y, \frac{1}{2}\Lambda)$ of said Fourier series, there is a relative phase shift δΛ substantially null and
the complex amplitude of the first non zero harmonic of order higher than 2 is negligible with respect to the complex amplitudes of the harmonics of first order f $(x,y,\Lambda)$ and of second order $g(x,y, \frac{1}{2}\Lambda)$.

13. Device according to claim 11, including at least a layer having an optical index lower than the refractive index of the active layer.

14. Photo-emitting matrix including a plurality of photo-emitting devices of a laser beam made on a same substrate, wherein said photo-emitting devices are devices according to claim 11.

15. Device according to claim 1, wherein:
the medium of positive dielectric permeability is a semiconductor type material,
said material including an active optical member made up of a layer of a non linear material transparent to wavelengths of an infrared and terahertz range, said layer including a non linear waveguide transparent to said wavelengths, and having a positive dielectric permeability higher than that of said layer,
the period Λ, multiplied par an average refractive index of said layer, has a value close to a terahertz wavelength,
said device allowing a vertical emission of a terahertz wave at said terahertz wavelength, generated through conversion of optical frequency, in response to an illumination of the waveguide along the 0x axis under first and second optical frequencies $\omega_1$, $\omega_2$ different from the near infrared domain.

16. Device according to claim 15 wherein the parameters a, b, c, d and $h_g$ of the optical structure are chosen so that the second harmonic of $2^{nd}$ order $g(x,y,\frac{1}{2}\Lambda)$ of the Fourier series associated to the profile of the unit pattern has a complex amplitude β much higher than the complex amplitude α of the harmonic of $1^{st}$ order $f(x,y,\Lambda)$.

17. Device according to claim 1, including at least an optical member, and wherein:
said medium of positive dielectric permeability is vacuum;
said active optical member is an electron emitter with a tip effect, emitting along the −0y axis, the electron emission being controlled by an optical wave,
the period Λ of the optical structure is close to the wavelength of said optical wave.

18. Device according to claim 17, wherein said emitter includes a photoconducting member disposed in the vicinity of the optical structure, the electron emission being controlled by the photoconductivity of said member.

19. Device according to claim 18, wherein said emitter includes a nanowire or nanotube, oriented along −0y, of a photosensitive conducting material, which constitutes said photoconducting member.

20. Device according to claim 18, wherein said photoconducting member is a diode or a semi-conducting resistor.

21. Device according to claim 17, wherein the electron emission is controlled by the electrical field of the optical wave, the optical structure resulting in a re-orientation of this electrical field in the emission axis of the emitter.

22. Device according to claim 17, wherein said electron emitter includes a carbon nanotube or a semi-conducting or metal nanowire.

23. Device according to any of claim 17, wherein said emitter is disposed in the vicinity of the plane of symmetry, at a distance from said plane along 0x in the order of Λ/4.

24. Device according to claim 17, including first and second emitters disposed on either side of the plane of symmetry, each one at about Λ/4 from said plane along 0x.

25. Device according to claim 17, including a plurality of electron emitters aligned along 0z, in said third area.

26. Device according to claim 22, including first and second incident optical sources, for generating a terahertz signal.

27. Device according to claim 17, characterised including a plurality of optical structures formed on a same support.

28. Electron source emission with an optical modulation of electrical field including an electron beam emission device according to claim 17.

29. Device according to claim 6, wherein:
the medium of positive dielectric permeability is a semiconductor type material,
said active optical member is an active layer of said material allowing an optical gain and a laser emission,
the period Λ, multiplied by the refractive index of the layer 20, is close to the wavelength emitted,
said device allows a vertical extraction of the laser emission,
wherein the parameters a, b, c, d and $h_g$ of said optical structure are chosen so that the second harmonic $2^{nd}$ order $g(x,y,\frac{1}{2}\Lambda)$ of Fourier series associated to the profile of the unit pattern has a complex amplitude β much higher than the complex amplitude α of the harmonic of $1^{st}$ order $f(x,y,\Lambda)$.

30. Device according to claim 6, wherein:
the medium of positive dielectric permeability is a semiconductor type material,
said material including an active optical member made up of a layer of a non linear material transparent to wavelengths of an infrared and terahertz range, said layer including a non linear waveguide transparent to said wavelengths, and having a positive dielectric permeability higher than that of said layer,
the period Λ, multiplied par an average refractive index of said layer, has a value close to a terahertz wavelength,
said device allowing a vertical emission of a terahertz wave at said terahertz wavelength, generated through conversion of optical frequency, in response to an illumination of the waveguide along the 0x axis under first and second optical frequencies $\omega_1$, $\omega_2$ different from the near infrared domain,
wherein the parameters a, b, c, d and $h_g$ of the optical structure are chosen so that the second harmonic of $2^{nd}$ order $g(x,y,\frac{1}{2}\Lambda)$ of the Fourier series associated to the profile of the unit pattern has a complex amplitude β much higher than the complex amplitude α of the harmonic of $1^{st}$ order $f(x,y,\Lambda)$.

\* \* \* \* \*